(12) United States Patent
Wu et al.

(10) Patent No.: US 11,492,274 B2
(45) Date of Patent: Nov. 8, 2022

(54) LIQUID TREATMENT APPARATUS

(71) Applicant: NATIONAL CHIAO TUNG UNIVERSITY, Hsinchu (TW)

(72) Inventors: Jong-Shinn Wu, Hsinchu (TW); Mu-Chien Wu, Tainan (TW); Satoshi Uehara, Miyagi (JP); Takehiko Sato, Miyagi (JP)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 316 days.

(21) Appl. No.: 16/885,300

(22) Filed: May 28, 2020

(65) Prior Publication Data

US 2021/0371305 A1  Dec. 2, 2021

(51) Int. Cl.
*C02F 1/46* (2006.01)
*H01J 37/32* (2006.01)
*B08B 3/00* (2006.01)

(52) U.S. Cl.
CPC .............. *C02F 1/4608* (2013.01); *B08B 3/00* (2013.01); *H01J 37/3244* (2013.01); *H01J 37/32348* (2013.01); *H01J 37/32568* (2013.01); *H01J 37/32577* (2013.01); *C02F 2303/04* (2013.01); *H01J 2237/33* (2013.01)

(58) Field of Classification Search
CPC combination set(s) only.
See application file for complete search history.

(56) References Cited

U.S. PATENT DOCUMENTS 4,743,405 A * 5/1988 Durao ................... C02F 3/1294
261/76
6,228,266 B1  5/2001 Shim
7,572,998 B2  8/2009 Mohamed et al.
7,633,231 B2  12/2009 Watson
8,349,192 B2  1/2013 Takahashi et al.
(Continued)

FOREIGN PATENT DOCUMENTS

CN      105836872 B   12/2018
EP      2711342 A1    3/2014
(Continued)

OTHER PUBLICATIONS

Zdenko Machala et al., "Plasma agents in bio-decontamination by dc discharges in atmospheric air", Journal of Physics D: Applied Physics, vol. 43, 2010.
(Continued)

*Primary Examiner* — Lessanework Seifu
(74) *Attorney, Agent, or Firm* — CKC & Partners Co., LLC (57) ABSTRACT

A liquid treatment apparatus includes a water pump and a plasma jet generating device. A liquid inlet of the water pump is immersed in a liquid. A liquid outlet of the water pump is configured to eject the liquid from the liquid inlet out of the water pump without artificial bubbles in the liquid. A gas inlet of the plasma jet generating device is configured to be located out of the liquid. A pair of electrodes of the plasma jet generating device is configured to generate plasma jet by the gas from the gas inlet. The plasma jet outlet is configured to be immersed in the liquid and in proximity to the liquid outlet of the water pump so that the gas is automatically entrained into the gas inlet of the plasma jet generating device when the liquid is ejected out from the liquid outlet.

19 Claims, 12 Drawing Sheets

(56) References Cited

U.S. PATENT DOCUMENTS

2017/0128906 A1* 5/2017 Louis .................... C02F 1/4608
2020/0407247 A1* 12/2020 Horikoshi ................ H05H 1/24

FOREIGN PATENT DOCUMENTS

| | | |
|---|---|---|
| JP | 4069211 B2 | 4/2008 |
| TW | 201605538 A | 2/2016 |
| TW | 201742828 A | 12/2017 |
| WO | 2016017456 A1 | 2/2016 |
| WO | WO2019197649 * | 10/2019 |

OTHER PUBLICATIONS

Satoshi Ikawa et al., "Effects of pH on Bacterial Inactivation in Aqueous Solutions due to Low-Temperature Atmospheric Pressure Plasma Application", Plasma Processes and Polymers, vol. 7, 2010, pp. 33-42.

Fuxiang Liu et al., "Inactivation of Bacteria in an Aqueous Environment by a Direct-Current, Cold-Atmospheric-Pressure Air Plasma Microjet", Plasma Processes and Polymers, vol. 7, 2010, pp. 231-236.

H. Ikeura et al., "Removal of residual pesticide, fenitrothion, in vegetables by using ozone microbubbles generated by different methods", Journal of Food Engineering, vol. 103, 2011, pp. 345-349.

Tomohiro Shibata et al., "Water Treatment Characteristics Using Activated Air Microbubble Jet with Photochemical Reaction", Journal of Fluid Science and Technology, vol. 6, No. 2, 2011, pp. 242-251.

Ying Tian et al., "Assessment of the Physicochemical Properties and Biological Effects of Water Activated by Non-Thermal Plasma Above and Beneath the Water Surface", Plasma Processes and Polymers, vol. 12, 2015, pp. 439-449.

Satoshi Ikawa et al., "Physicochemical properties of bactericidal plasma-treated water", Journal of Physics D: Applied Physics, vol. 49, 2016.

Yanan Liu et al., "Degradation of aniline in aqueous solution using non-thermal plasma generated in microbubbles", Chemical Engineering Journal, vol. 345, 2018, pp. 679-687.

Martynas Tichonovas et al., "Degradation of various textile dyes as wastewater pollutants under dielectric barrier discharge plasma treatment", Chemical Engineering Journal, vol. 229, 2013, pp. 9-19.

Ronny Brandenburg et al., "White paper on the future of plasma science in environment, for gas conversion and agriculture", Plasma Processes and Polymers, vol. 16, 2019.

* cited by examiner

LIQUID TREATMENT APPARATUS

BACKGROUND

Field of Invention

The present disclosure relates to a liquid treatment apparatus.

Description of Related Art

The statements in this section merely provide background information related to the present disclosure and do not necessarily constitute prior art.

In recent years, many studies have pointed out that plasma activated water (PAW) possesses strong sterilization ability, and can be used to avoid bacterial or microbial infection. It also shows great potential for application in biomedicine, food, agriculture and fishery. Since the PAW also contains the nutrient such as nitrate that can stimulate the plant growth, it also possesses great potential in agriculture application.

In an industry related to treating wastewater, plasma generated in liquid can generate extremely strong and irreplaceable chemicals, such as OH radicals or superoxide anions which can only exist for a short time in a range between nanosecond and microsecond. These short-lived species can interact with pollutants directly. Therefore, it can decompose most of the pollutants and organic substances effectively, and also some long-lived chemical active substances in the liquid would decay over time without the residual problems, which is good to the environment. The plasma generated in water is thus considered to be very promising for wastewater treatment. In addition, since ambient air contains nitrogen, air plasma may produce a considerable concentration of NO3— in water, which can be used for agricultural nitrogen fertilizer.

SUMMARY

Although the PAW is promising as mentioned in the above, there is still much room for improvement such as enhancement of the solubility of gases into water, or a total volume of water can be treated by plasma per unit time. In view of this, it is an object of the present disclosure to propose a liquid circulation mechanism to generate plasma in liquid combining microbubbles. By taking advantage of microbubbles, the dissolution of chemical species can be enhanced (e.g., water). This proposed method could generate plasma and microbubbles in a more economical way and also exhibits better mixing effect of plasma and pollutants. As will be shown below, the liquid is in direct contact with a discharge area of plasma formation, so as to further improve an effectiveness of a purifying process.

According to some embodiments of the present disclosure, a liquid treatment apparatus is provided. The liquid treatment apparatus includes a water pump and a plasma jet generating device. The water pump includes a liquid inlet and a liquid outlet. The liquid inlet is configured to be immersed in a liquid, and the liquid outlet is configured to eject the flowing liquid from the liquid inlet out of the water pump without artificial microbubbles in the liquid. The plasma jet generating device includes a gas inlet, a pair of electrodes, and a plasma jet outlet. The gas inlet is configured to be located out of the liquid. The pair of the electrodes is configured to generate a plasma jet near the plasma jet outlet by a gas from the gas inlet. The plasma jet outlet is configured to be immersed in the liquid and to emit the plasma jet generated by the electric field generated from the pair of the electrodes. The plasma jet outlet is in proximity to the liquid outlet of the water pump so that the ambient gas is automatically entrained into the gas inlet of the plasma jet generating device due to the low-pressure zone near the plasma jet when the liquid is ejected out from the liquid outlet.

In one or more embodiments of the present disclosure, the liquid is water.

In one or more embodiments of the present disclosure, the liquid treatment apparatus further includes a liquid container, in which the liquid is in the liquid container.

In one or more embodiments of the present disclosure, the liquid treatment apparatus further includes a valve on a wall of the liquid container and the valve is configured to control an amount of the liquid flowing out of the liquid container.

In one or more embodiments of the present disclosure, the liquid treatment apparatus further includes a bubble generating tube. The bubble generating tube includes an inlet, an outlet, and a device insertion portion. The inlet is connected to the liquid outlet of the water pump. The outlet is connected to the liquid container. The device insertion portion is on a sidewall of the bubble generating tube and is between the inlet and the outlet. The plasma jet generating device is disposed on the device insertion portion.

In one or more embodiments of the present disclosure, the bubble generating tube further includes another device insertion portion and another plasma jet generating device disposed on another device insertion portion. Another device insertion portion is on the sidewall of the bubble generating tube and is between the inlet and the outlet. Another device insertion portion is spaced apart from the device insertion portion.

In one or more embodiments of the present disclosure, a flow tunnel of the bubble generating tube is divided into two branches between the inlet and the outlet, and the two branches are respectively connected to the device insertion portion and another device insertion portion.

In one or more embodiments of the present disclosure, the bubble generating tube further includes a liquid separating component between the inlet and the device insertion portion.

In one or more embodiments of the present disclosure, the pair of the electrodes includes a first electrode and a second electrode. The plasma jet generating device further includes a dielectric portion between the first electrode and the second electrode.

In one or more embodiments of the present disclosure, the dielectric portion and the first electrode define a channel therebetween.

In one or more embodiments of the present disclosure, the first electrode is enclosed by the second electrode on a plane perpendicular to an extension direction of the channel.

In one or more embodiments of the present disclosure, the first electrode is provided with a power electrode, and the second electrode is provided with a ground electrode.

In one or more embodiments of the present disclosure, the first electrode is provided with a ground electrode, and the second electrode is provided with a power electrode.

In one or more embodiments of the present disclosure, the outlet part of plasma jet generating device further includes a porous material.

In one or more embodiments of the present disclosure, there is no artificial bubbles in the liquid when the liquid is ejected out of the water pump.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

In various embodiments, the description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment" or the like means that a particular feature, structure, configuration, or characteristic described in connection with the embodiment is included in at least one embodiment of the disclosure. Thus, the appearances of the phrase "in one embodiment," "in an embodiment" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 1:
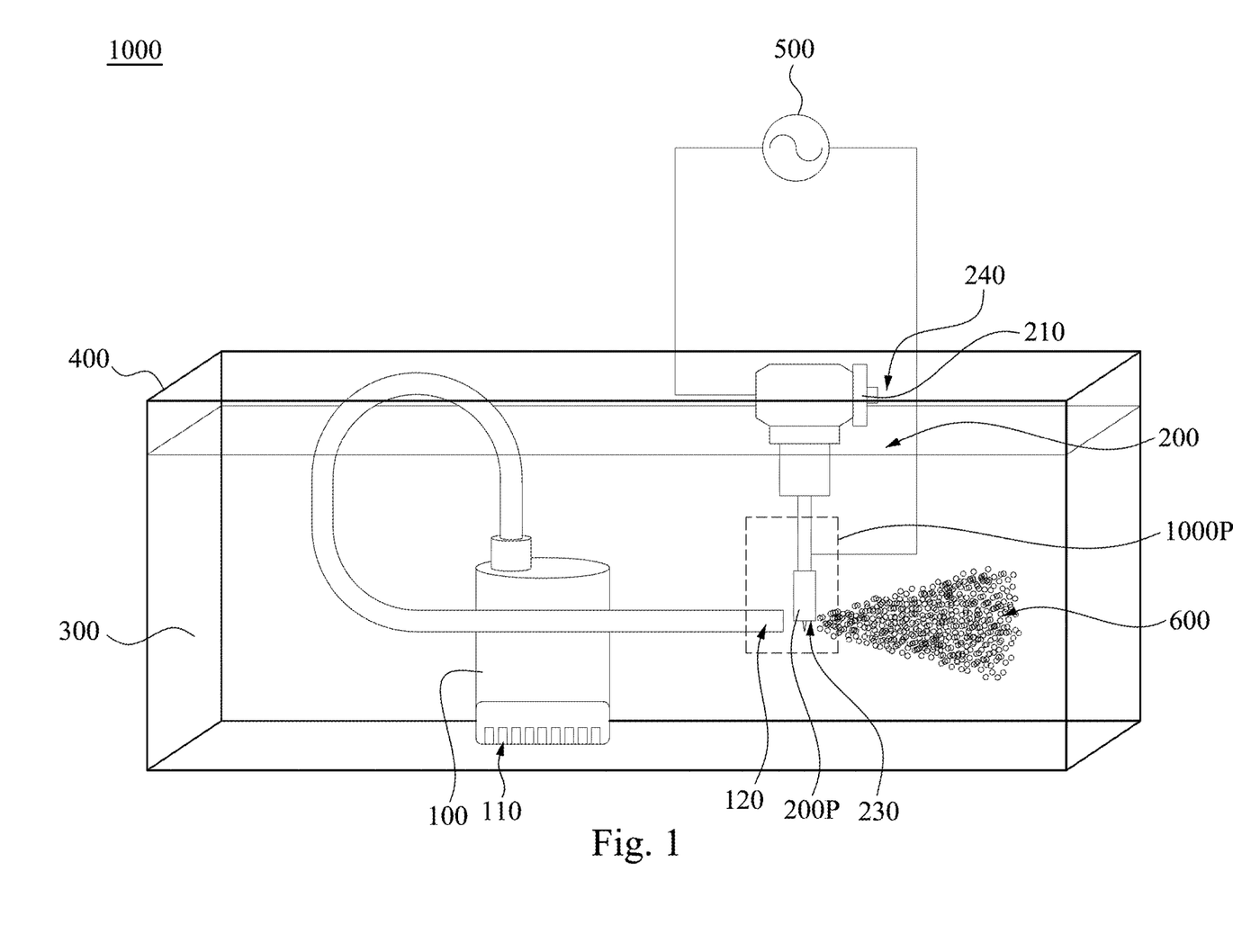
FIG. 1 is a schematic diagram of a liquid treatment apparatus according to some embodiments of the present disclosure.

Reference is made to FIG. 1. FIG. 1 is a schematic diagram of a liquid treatment apparatus 1000 according to some embodiments of the present disclosure. The liquid treatment apparatus 1000 includes a water pump 100 and a plasma jet generating device 200. Types of the water pump 100 are not strictly limited in the present disclosure. The water pump 100 includes a liquid inlet 110 and a liquid outlet 120. The liquid inlet 110 is immersed in a liquid 300 and is capable of absorbing the liquid 300 by the water pump 100. The liquid outlet 120 is configured to eject the liquid 300 out of the water pump 100 after the liquid 300 is absorbed by the liquid inlet 110. The liquid 300 ejected out from the liquid outlet 120 is without artificial bubbles therein. The "without artificial bubbles" is emphasized herein because in conventional apparatus for purifying the liquid 300, bubbles are generated before plasma is formed. However, in the present disclosure, the ejected liquid 300 from the liquid outlet 120 is not pre-treated by any mechanism on the way before the liquid outlet 120. That is, the ejected liquid 300 do not have bubbles therein before contacting the plasma. More details on this set up and the corresponding benefits will be illustrated later. It is noted that in most of the present disclosure the liquid 300 can be water, water waiting for treatment, or water after treatment. However, other kinds of liquids do not depart from the scope of the present disclosure.

Figure 2A:
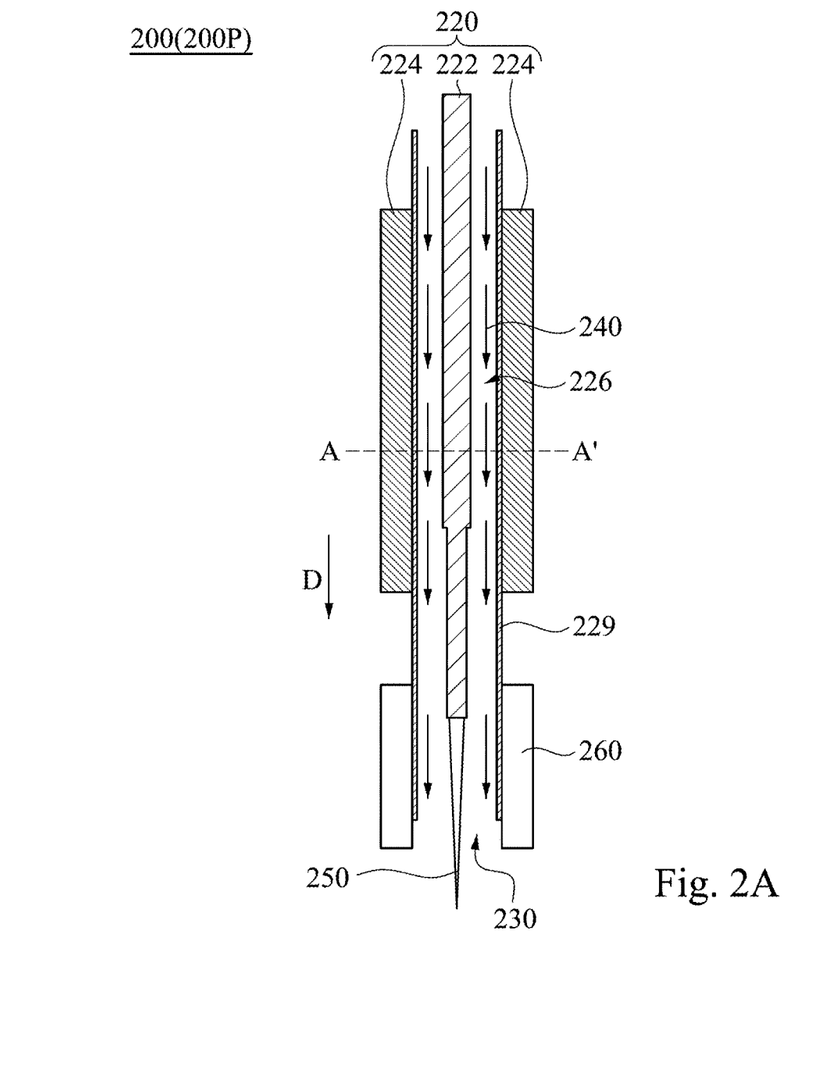
FIG. 2A is a schematic cross-sectional view of a portion of a plasma jet generating device according to some embodiments of the present disclosure.
Figure 2B:
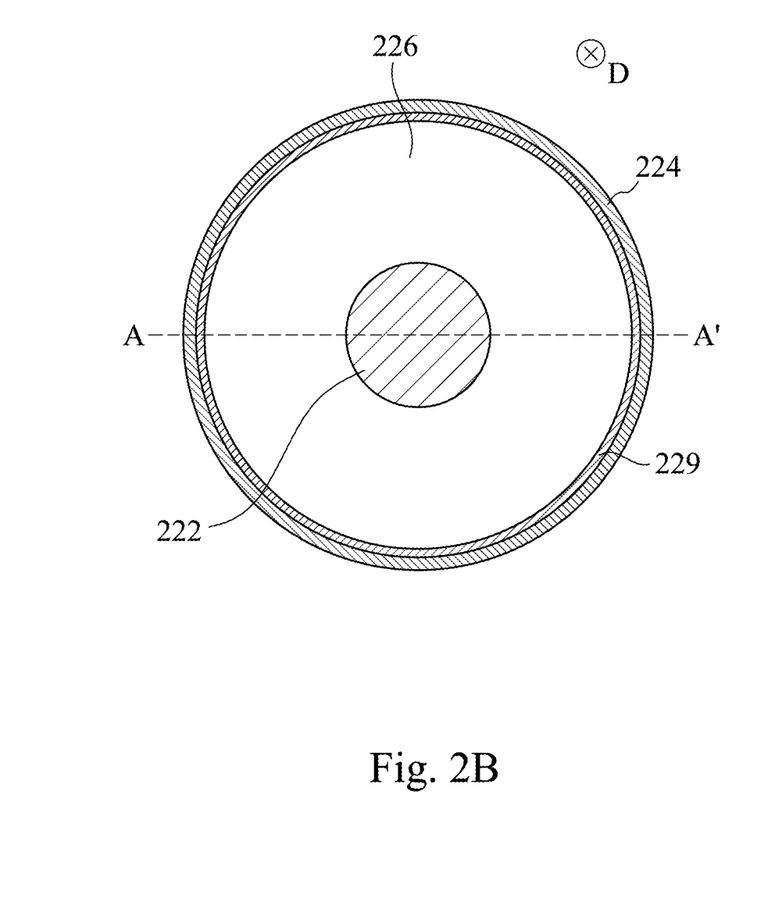
FIG. 2B is a schematic cross-sectional view of the portion of the plasma jet generating device according to some embodiments of the present disclosure.

Reference is made to FIGS. 1, 2A, and 2B. FIG. 2A is a schematic cross-sectional view of a portion 200P of the plasma jet generating device 200 according to some embodiments of the present disclosure. FIG. 2B is a schematic cross-sectional view of the portion 200P of the plasma jet generating device 200 taken along a line A-A' in FIG. 2A according to some embodiments of the present disclosure. The plasma jet generating device 200 includes a gas inlet 210 (as labeled in FIG. 1), a pair of electrodes 220, and a plasma jet outlet 230. The gas inlet 210 is located out of the liquid 300. The pair of the electrodes 220 are configured to generate plasma by a gas 240 entranced from the gas inlet 210 and the plasma form a plasma jet 250 near the plasma jet outlet 230 with abundant chemical species therein. The gas 240 used may be ambient air, nitrogen, argon, carbon dioxide, inert gas, or combinations thereof, but should not be limited thereto. The plasma jet outlet 230 is immersed in the liquid 300 and is configured to emit the plasma jet 250 generated by the pair of the electrodes 220. The plasma jet outlet 230 is in proximity to the liquid outlet 120 of the water pump 100 so that the gas 240 is automatically (i.e., forced by a pressure difference) entrained into the gas inlet 210 when the liquid 300 is ejected out from the liquid outlet 120 and passes through the position where the plasma jet outlet 230 is. The "automatically" as mentioned is achieved due to a high velocity of the liquid 300 near the plasma jet outlet 230 which forms the pressure difference between places near the plasma jet outlet 230 and near the gas inlet 210. In some embodiments, the liquid treatment apparatus 1000 further includes a liquid container 400. The liquid 300 is restricted in the liquid container 400.

FIGS. 2A and 2B illustrates one type of the plasma jet generating device 200 within the scope of the present disclosure. In some embodiments, the pair of the electrodes 220 includes a first electrode 222 and a second electrode 224, and the plasma jet generating device 200 further includes a dielectric portion 229 between the first electrode 222 and the second electrode 224 to prevent from arcing. The dielectric portion 229 may be made of glass, quartz, ceramics, and/or polymers, but should not be limited thereto. In some embodiments, a channel 226 is between and defined by the dielectric portion 229 and the first electrode 222. The channel 226 is for the gas 240 to pass through and the plasma jet 250 is also generated in the channel 226.

Figure 2C:
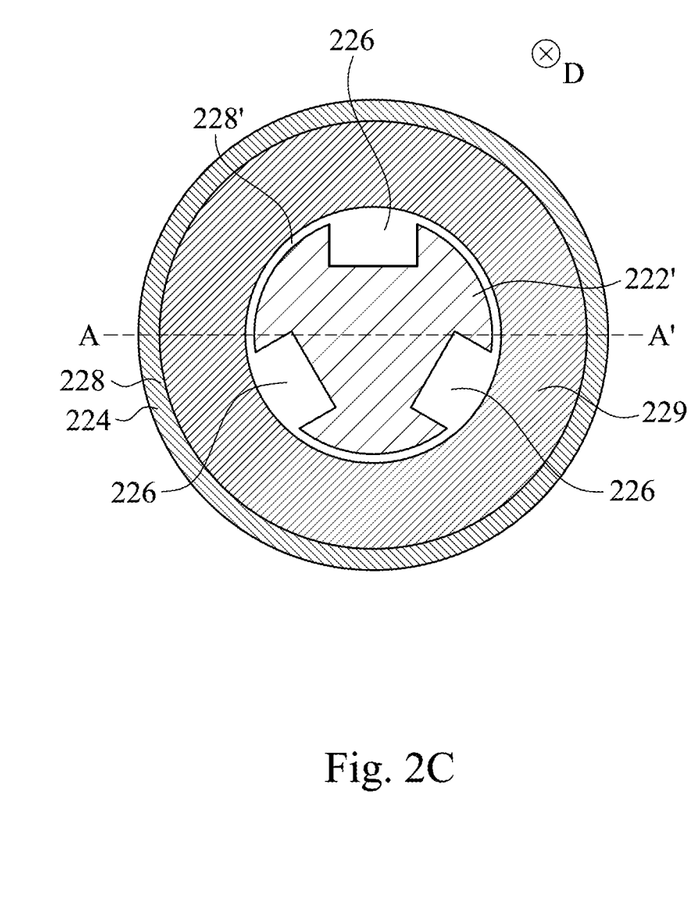
FIG. 2C is a schematic cross-sectional view of the portion of the plasma jet generating device according to some embodiments of the present disclosure.

Reference is made to FIG. 2C. FIG. 2C is a schematic cross-sectional view of the portion 200P of the plasma jet generating device 200 taken along the line A-A' in FIG. 2A according to some embodiments of the present disclosure. FIG. 2C illustrates alternative embodiments compared to the embodiments illustrated by FIG. 2B. Noted that a geometry of the first electrode 222' illustrated by FIG. 2C is different from the first electrode 222 illustrated by FIG. 2B. The first electrode 222' illustrated herein may shrink a volume of the channel 226 to enhance the plasma intensity. Note that the geometry of the first electrode 222 (222') should not be limited thereto.

It is noted that in the embodiments illustrated by FIGS. 2B and 2C, a configuration of the pair of the electrodes 220 is concentric. In some embodiments, the first electrode 222 (222') is enclosed by the second electrode 224 on a plane perpendicular to the extension direction D of the second electrode 224. The above configuration of the pair of the electrodes 220 separated by a dielectric portion 229 can avoid an arc discharge from damaging the electrodes due to excessive currents between the two electrodes 222(222') and 224. However, the concentric set up is not a limitation. The pair of the electrodes 220 may be arranged in other configurations, such as parallel flat electrodes.

The pair of the electrodes 220 may be electrically connected to an external power source 500 which is configured to provide voltages to the pair of the electrodes 220. In some embodiments, the first electrode 222(222') is provided with a power electrode, and the second electrode 224 is provided with a ground. In some other embodiments, the first electrode 222(222') is provided with the ground, and the second electrode 224 is provided with the power electrode. These two modes can be switched at will according to different applications.

In some embodiments, due to the high velocity (e.g., the flowing velocity as mentioned) and with combinations with one or more embodiments as illustrated by FIGS. 1 to 2C, a relatively low pressure zone compared to an ambient pressure is formed near the plasma jet 250. Since the ambient pressure near the gas inlet 210 of the plasma generating device 200 is greater than the low pressure zone, the gas 240 is automatically entrained into the plasma jet generating device 200 through the gas inlet 210.

After that, a high electric field produced by the power electrode and the ground in the channel 226 ionizes the gas 240 to generate an atmospheric-pressure plasma. The atmospheric-pressure plasma ejected out of the channel 226 through the plasma jet outlet 230 is in a form of the plasma jet 250. Using the above configurations with proper tunings, the plasma generated can be a non-thermal plasma in which electrons and ions therein are not in thermodynamic equilibrium. The non-thermal plasma may contain abundant particles with great chemical activity and/or energy, such as free radicals, free electrons, charged ions, and more specifically, reactive oxygen/nitrogen species (RONS) . . . etc. The RONS may contain hydroxyl radical (OH.), nitric oxide radical (NO.) and superoxide radical ($O_2.^-$), but should not be limited thereto.

Owing to a great velocity difference between the plasma activated gas 240 (i.e. the plasma jet 250) and the liquid 300 flow, a turbulent region with different sizes of turbulent eddies due to a large strain rate is formed. The plasma activated gas 240 containing abundant reactive chemical species as mentioned is broken into many plasma activated microbubbles (PAMBs) 600 afterwards. The PAMBs 600 generated by the above embodiments possess many superior characteristics for applications of purifying the liquid 300 compared to plasma bubbles generated by known technologies. Some of the superior characteristics of said microbubbles are shown below: (1) large gas-liquid interfacial area; (2) long residence time in the liquid 300; and (3) high inner pressure of microbubbles (e.g., around 3 bars if a size of the microbubbles is one micrometer in diameter). Furthermore, since the plasma with the reactive chemical species therein is formed before forming the microbubbles, a "Debye length" issue of generating the plasma within existing bubbles can be avoided. The issue requires sizes of bubbles greater than a characteristic length (i.e., the Debye length) to be able to generate plasma. However, in the embodiments of the present disclosure, PAMBs 600 with the reactive chemical species therein generated by the plasma jet 250 are formed under turbulence shear stress due to the high velocity liquid 300 flow. In other words, the reactive chemical species are generated at first, and then the PAMBs 600 encapsulate the chemical species in the embodiments of the present disclosure.

As a result, the embodiments as mentioned can dramatically enhance dissolution of the reactive chemical species in the liquid 300 (e.g., water). The liquid treatment apparatus 1000 is able to discharge within the liquid 300 and generate many PAMBs 600 in order to either to generate high concentration PAW or is easily scale up to generate a large amount of PAW. The large amount of PAW can be generated at least partially due to a design of a recirculating liquid system (i.e., the liquid treatment apparatus 1000) as shown in the embodiments illustrated by FIG. 1. A design of the recirculating liquid system in the above embodiments of the present disclosure is relatively simple compared to conventional systems for combining plasma and microbubble together. The PAMBs 600 generated in the above embodiments are proven to have high concentration of the reactive chemical species which are considered to be one of important factors in sterilization, promoting plants growth, and reducing hazardous substances or some toxic compounds in water, among others. Therefore, the liquid treatment apparatus 1000 illustrated by the above embodiments of the present disclosure show a great potential in traditional industry such as food processing, agriculture, and fishing.

Figure 2D:
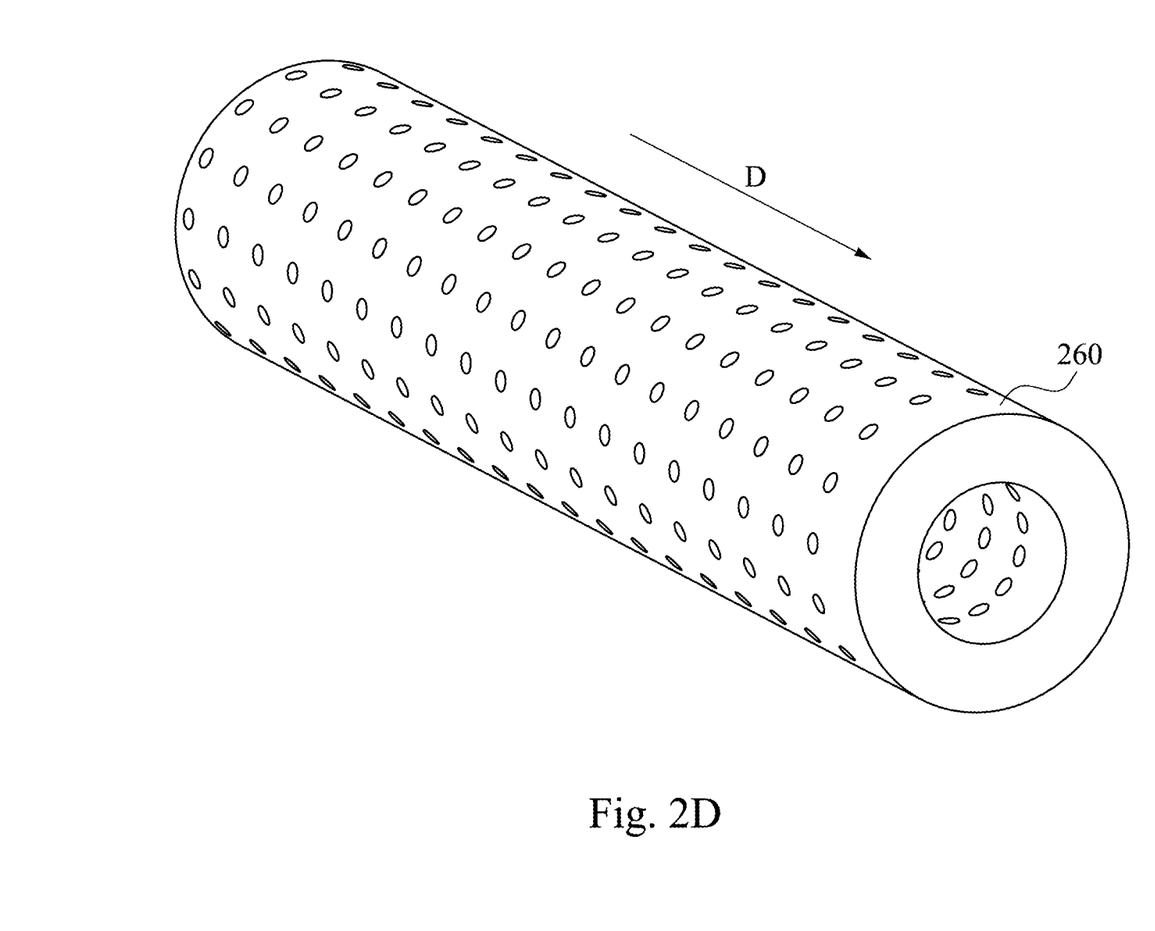
FIG. 2D is a schematic view of a porous material according to some embodiments of the present disclosure.

Reference is made to FIGS. 2A and 2D. FIG. 2D is a schematic view of a porous material 260 according to some embodiments of the present disclosure. In some embodiments, the plasma jet generating device 200 optionally includes a porous material 260 around the plasma jet outlet 230. The porous material 260 may be porous ceramics with the pore size ranging from nanometer to micrometer, but should not be limited thereto. A set up of the porous material 260 may increase a formation of the PAMBs 600. The porous material 260 is also capable of increasing a density of the PAMBs 600 and/or decreasing the sizes of the PAMBs 600.

In the embodiments illustrated by FIGS. 1 to 2D, PAMBs 600 are generated under a condition that an input power is about 50 watts with frequency about 10-100 kHz. Parameters mentioned in this paragraph is just an exemplification, other ranges on power or frequency do not necessarily depart from the present disclosure.

Figure 3:
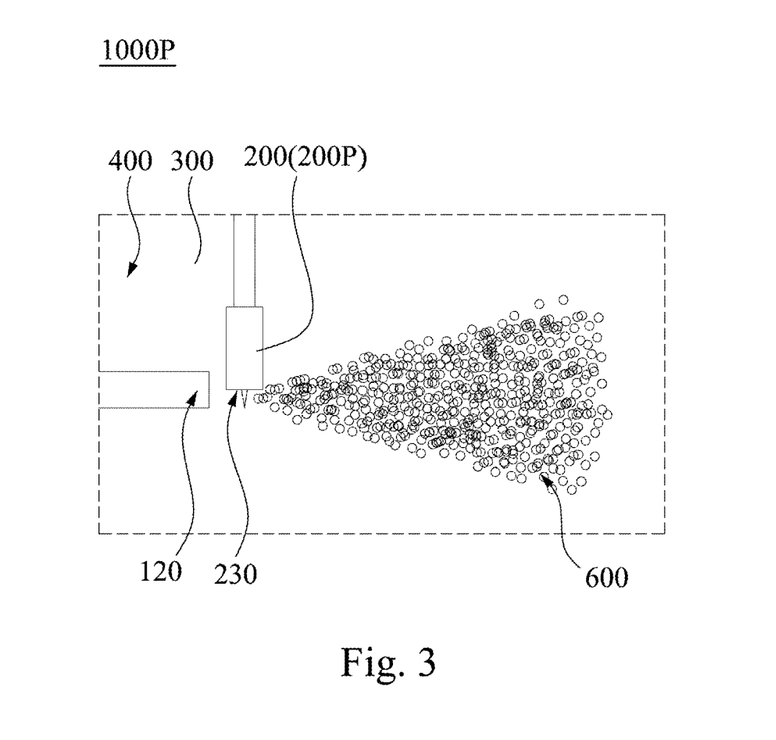
FIG. 3 is a schematic enlarged view on a portion of the liquid treatment apparatus as shown in FIG. 1 according to some embodiments of the present disclosure.
Figure 4:
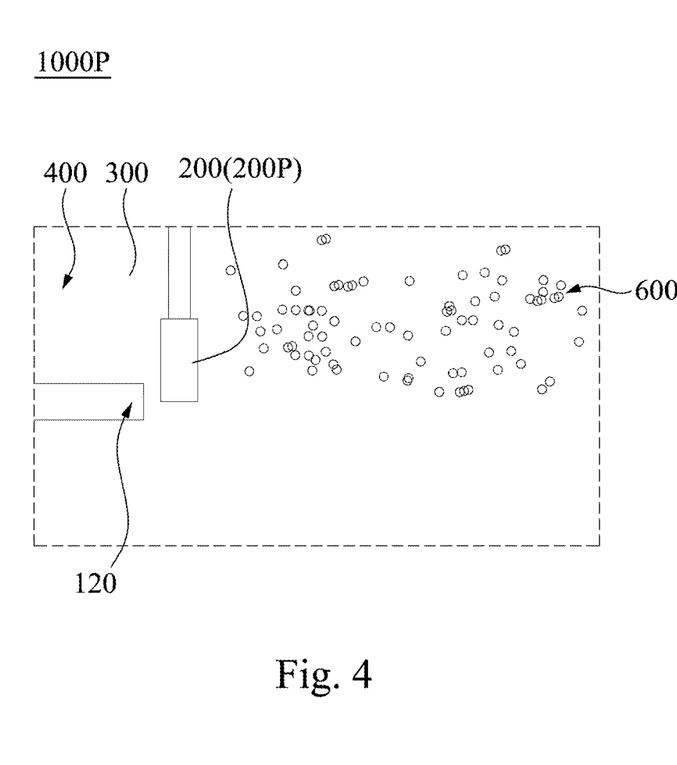
FIG. 4 is a schematic enlarged view on the portion of the liquid treatment apparatus as shown in FIG. 1 according to some embodiments of the present disclosure.

Reference is made to FIGS. 1, 3, and 4. FIG. 3 is a schematic enlarged view on the portion 1000P of the liquid treatment apparatus 1000 as shown in FIG. 1 when the water pump is turned on according to some embodiments of the present disclosure. FIG. 4 is a schematic enlarged view on the portion 1000P of the liquid treatment apparatus 1000 as shown in FIG. 1 when the water pump is turned off for a few seconds according to some embodiments of the present disclosure. FIGS. 3 and 4 are reproduced from real photos. In FIG. 3, it is found that the great amount of PAMBs 600 are generated. In FIG. 4, even after a few seconds, there are still some visible PAMBs 600 or PAMBs 600 clusters existed in the liquid 300.

Figure 5:
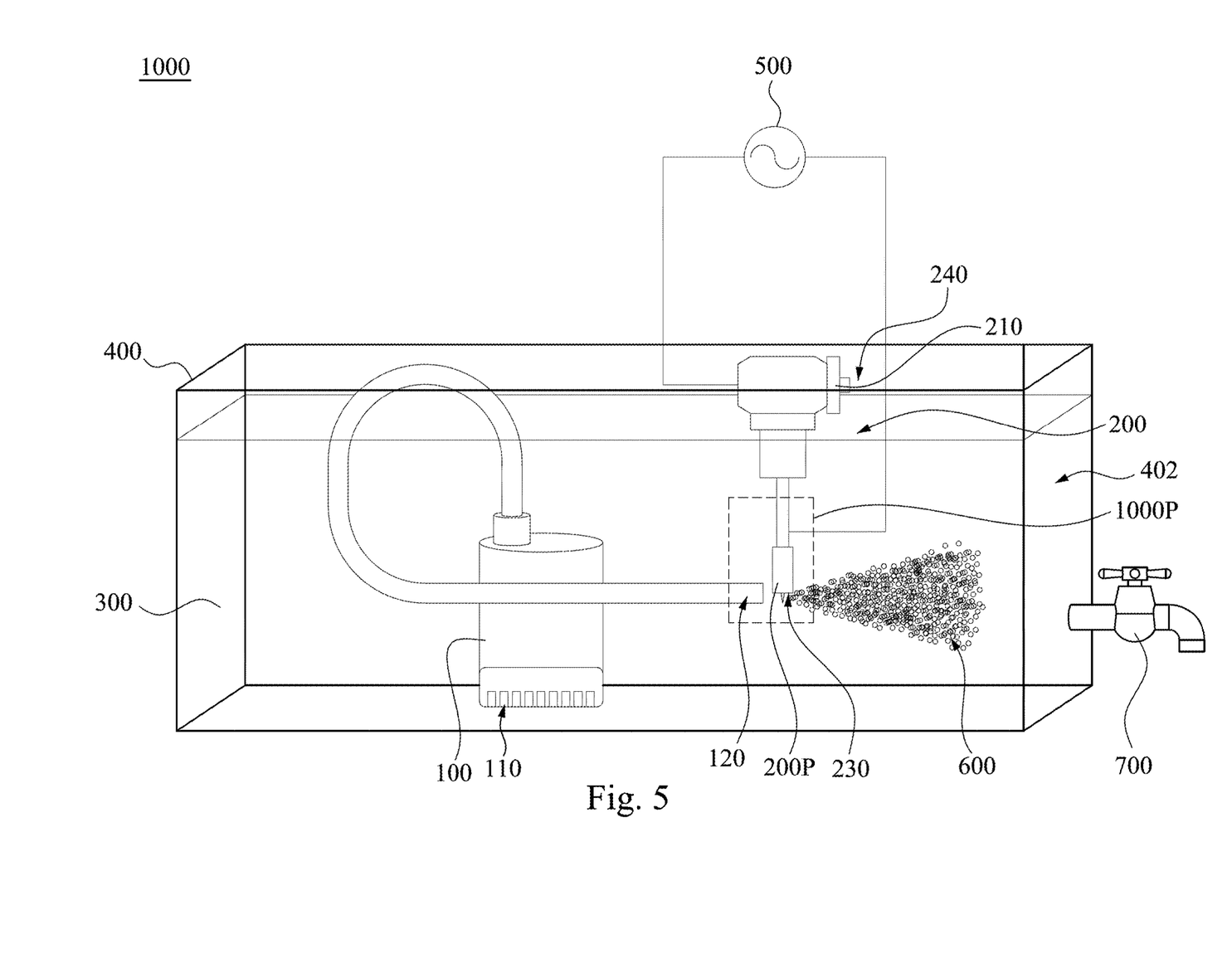
FIG. 5 is a schematic diagram of a liquid treatment apparatus according to some embodiments of the present disclosure.

Reference is made to FIG. 5. FIG. 5 is a schematic diagram of a liquid treatment apparatus 1000 according to some embodiments of the present disclosure. In some embodiments, the liquid treatment apparatus 1000 further includes a valve 700 which is on a wall 402 of the liquid container 400 and is configured to control an amount of the liquid 300 flowing out of the liquid container 400. Taking FIG. 5 as an example, the configuration makes the liquid container 400 a cyclic purifying container for the liquid 300 to be purified continuously. The valve 700 can be controlled by a user whenever the treated liquid 300 is needed.

Figure 6:
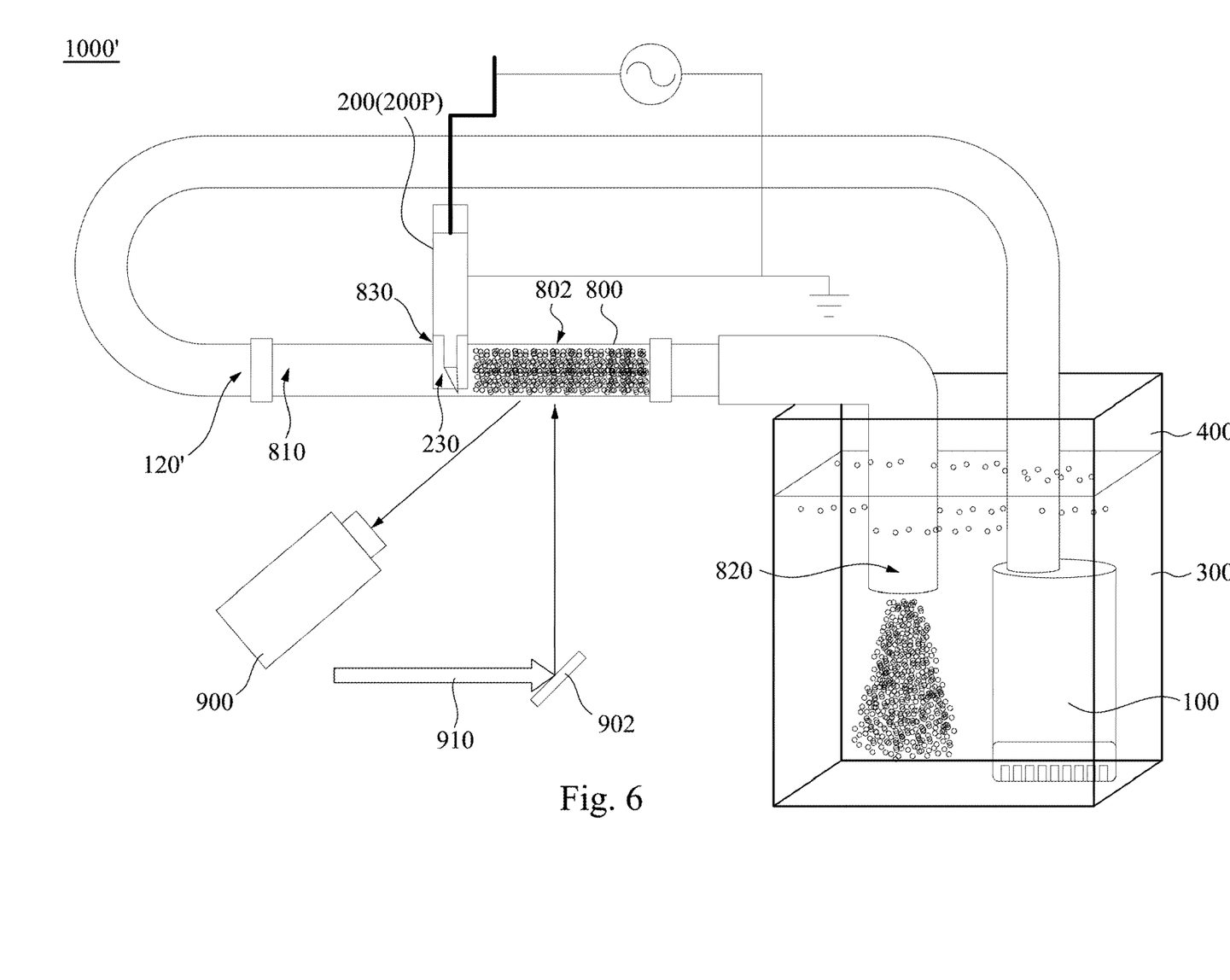
FIG. 6 is a schematic diagram of a liquid treatment apparatus according to some embodiments of the present disclosure.

Reference is made to FIG. 6. FIG. 6 is a schematic diagram of a liquid treatment apparatus 1000' according to some embodiments of the present disclosure. The liquid treatment apparatus 1000' further includes a bubble generating tube 800 compared to the liquid treatment apparatus 1000. The bubble generating tube 800 includes an inlet 810, an outlet 820, and a device insertion portion 830. The inlet 810 is connected to the liquid outlet 120 of the water pump 100. The outlet 820 is connected to the liquid 300 in the liquid container 400. The device insertion portion 830 is on a sidewall 802 of the bubble generating tube 800 and is disposed between the inlet 810 and the outlet 820. The plasma jet generating device 200 is disposed on and inserted into the device insertion portion 830 so that the plasma jet outlet 230 is immersed in the liquid 300 within the bubble generating tube 800. The device insertion portion 830 may be simply a hole, but should not be limited thereto. In some embodiments, the plasma jet outlet 230 is in close proximity to another side wall that is opposite to the sidewall 802 with the device insertion portion 830 thereon, so that the velocity of the liquid 300 near the plasma jet outlet 230 is enhanced so as to enhance the turbulences and shear forces.

The material of the bubble generating tube 800 may be transparent, so that an external monitoring device 900 (e.g., a camera, but should not be limited thereto) can monitor conditions of PAMBs 600 generated within the bubble generating tube 800. The monitoring can be performed by detecting a reflected laser 910 as a light source. The monitor conditions of PAMBs 600 can be assisted by an optical component 902 (e.g., a mirror, but should not be limited thereto). It is noted that in the above embodiments, sizes of most of the PAMBs 600 are still in a range between several micrometers to several hundred of micrometers in an area about 5 centimeters downstream of the plasma jet outlet 230 as measured from the monitoring device 900. The sizes as mentioned are small enough to exhibit the inner pressure which is high enough (e.g. 3 bars in one micrometer bubble) within the microbubbles, such that the dissolution of the reactive chemical species in the liquid 300 is dramatically enhanced.

Figure 7:
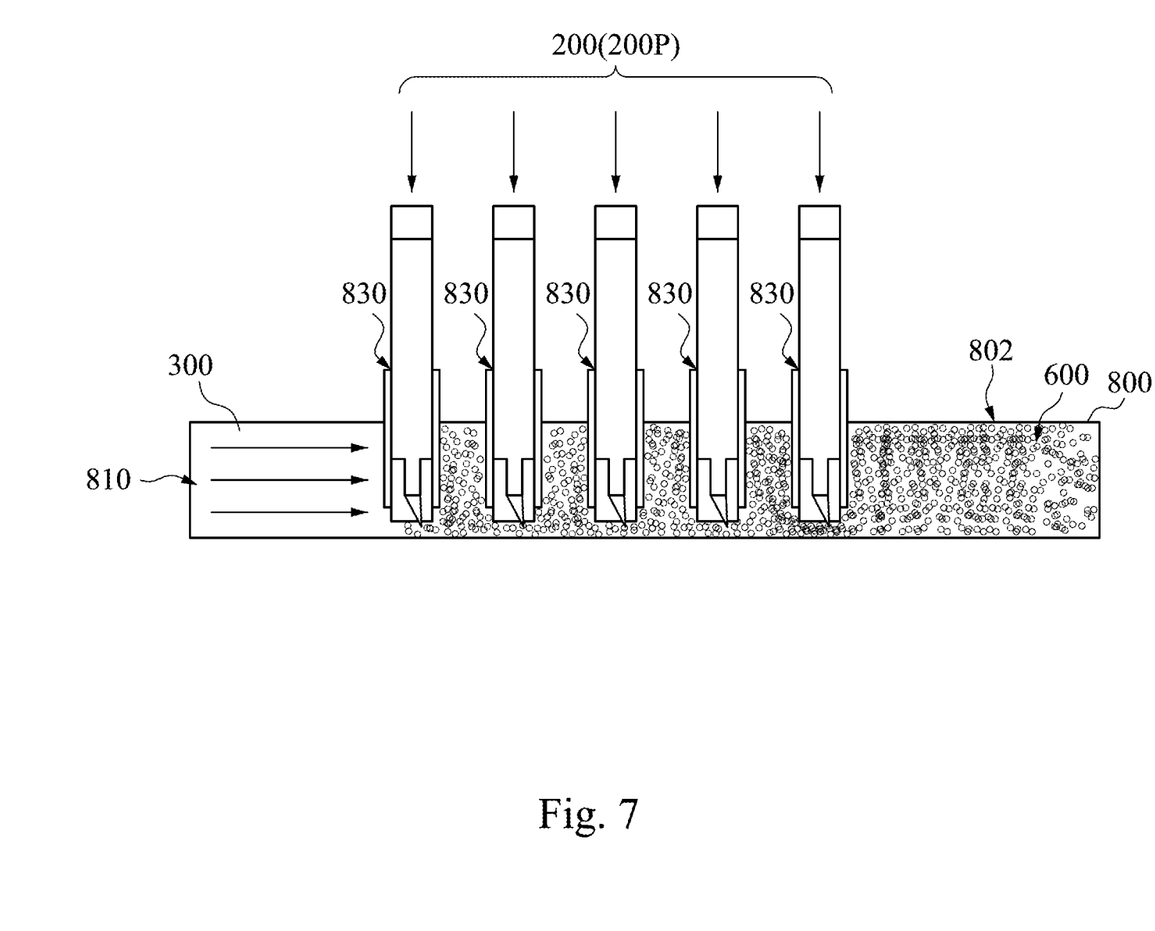
FIG. 7 is a schematic enlarged view of a bubble generating tube and a portion of the plasma jet generating device according to some embodiments of the present disclosure.

Reference is made to FIG. 7. FIG. 7 is a schematic enlarged view of the bubble generating tube 800 and the portion 200P of the plasma jet generating device 200 according to some embodiments of the present disclosure. In some embodiments, the bubble generating tube 800 further includes other device insertion portions 830 on the sidewall 802 of the bubble generating tube 800 and between the inlet 810 and the outlet 820. The other device insertion portions 830 are spaced apart from the device insertion portion 830. (An)other plasma jet generating device(s) 200(200P) is(are) disposed on the (an)other device insertion portion(s) 830. In this configuration with multiple plasma jet generating devices 200(200P), the amount of PAMBs 600 can be further increased.

Figure 8:
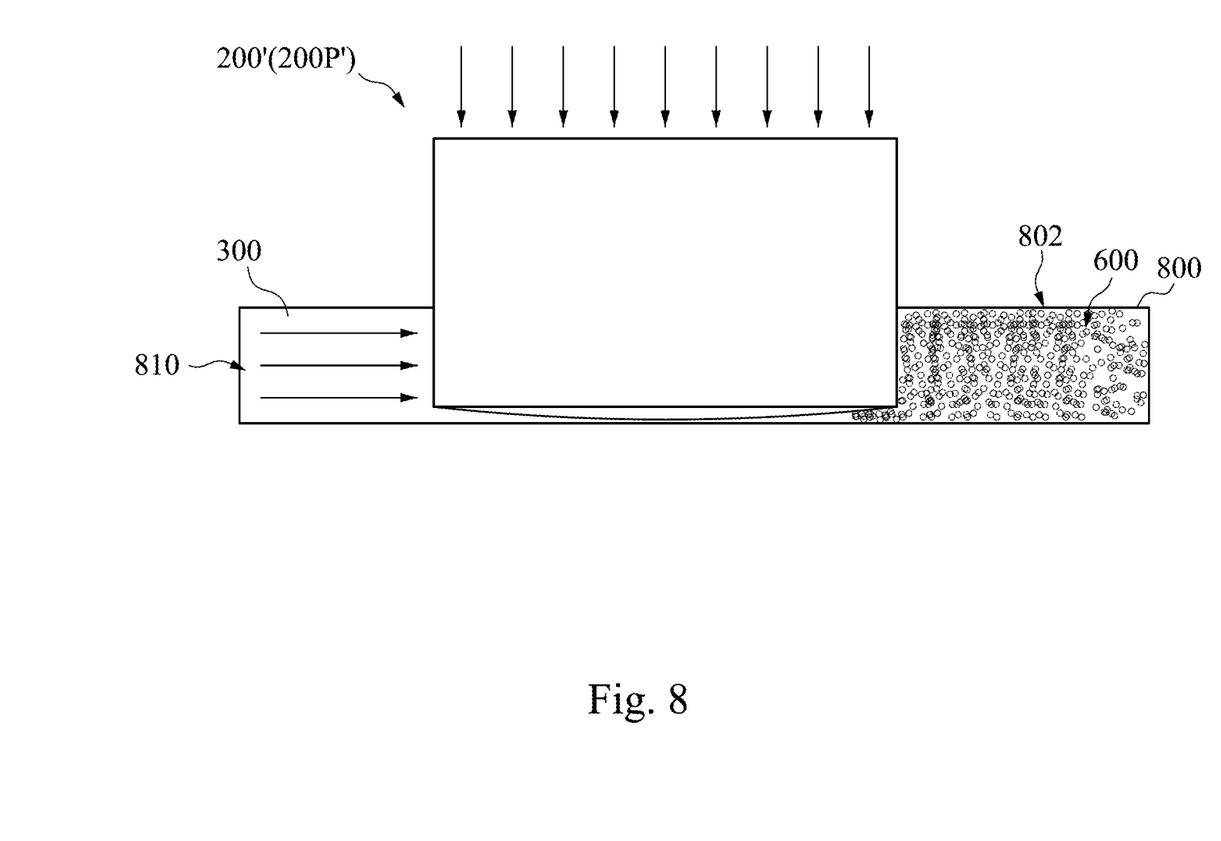
FIG. 8 is a schematic enlarged view of the bubble generating tube and a portion of a plasma jet generating device according to some embodiments of the present disclosure.

Reference is made to FIG. 8. FIG. 8 is a schematic enlarged view of the bubble generating tube 800 and a portion 200P' of a plasma jet generating device 200' according to some embodiments of the present disclosure. It is noted that a lateral length of the plasma jet generating device 200' is greater than that of the plasma jet generating device 200. The reason is that instead of a concentric structure as shown in FIGS. 2A to 2C, the plasma jet generating device 200' as shown in FIG. 8 exhibits parallel flat structure (e.g. Parallel dielectric-barrier discharge (DBD) configuration).

Figure 9:
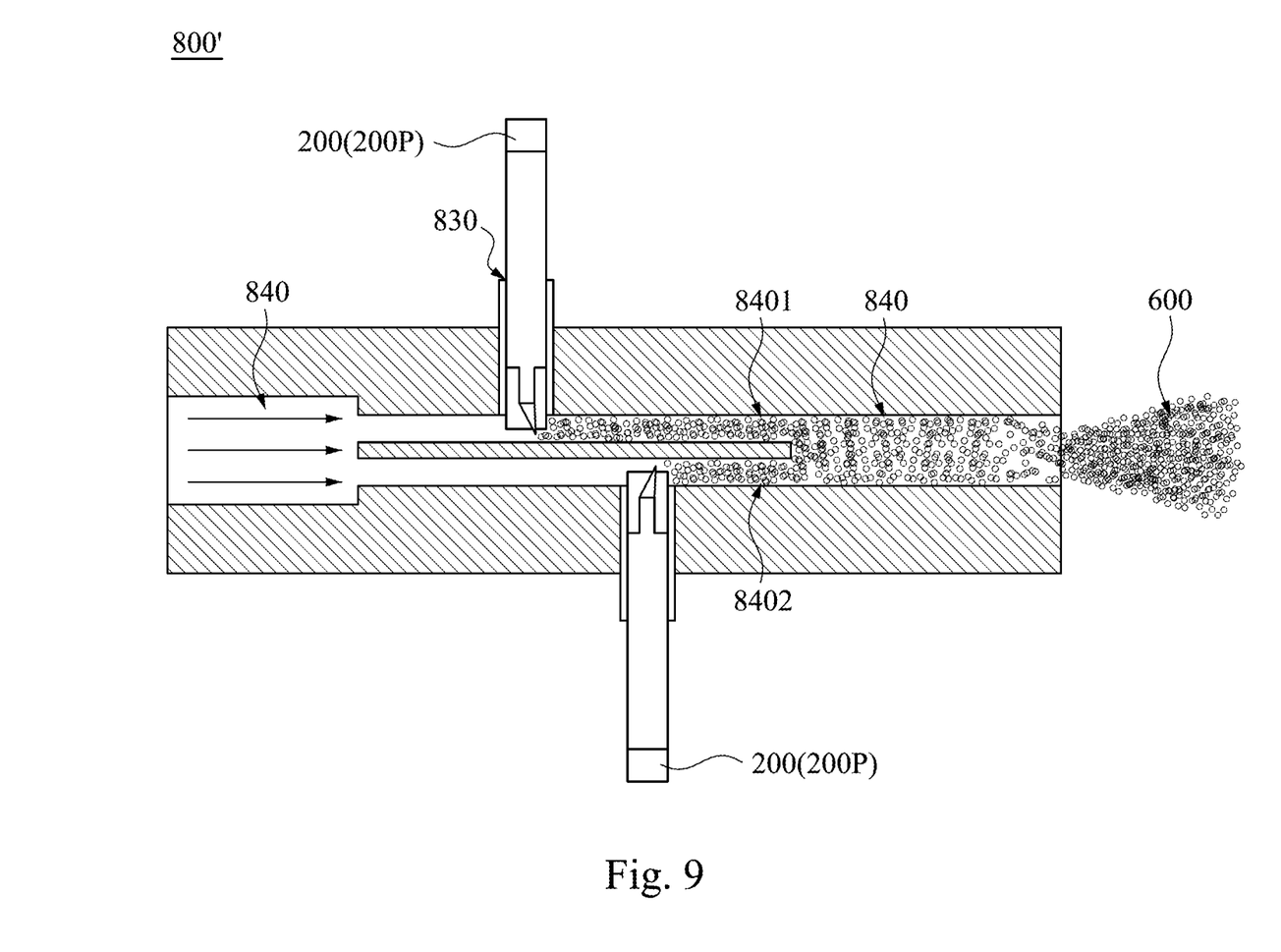
FIG. 9 is a schematic enlarged view of a bubble generating tube and portions of plasma jet generating devices according to some embodiments of the present disclosure.

Reference is made to FIG. 9. FIG. 9 is a schematic enlarged view of a bubble generating tube 800' and portions 200P of a plasma jet generating devices 200 according to some embodiments of the present disclosure. In some embodiments, a flow tunnel 840 of the bubble generating tube 800' is divided into two branches 8401, 8402 between the inlet and the outlet, and each of the branches 8401, 8402 includes the device insertion portion 830 thereon. Therefore there are at least one plasma jet generating device 200 connected to the branch 8401 through the device insertion portion 830 on the branch 8401 and at least one plasma jet generating device 200 connected to the branch 8402 through the device insertion portion 830 on the branch 8402.

Figure 10:
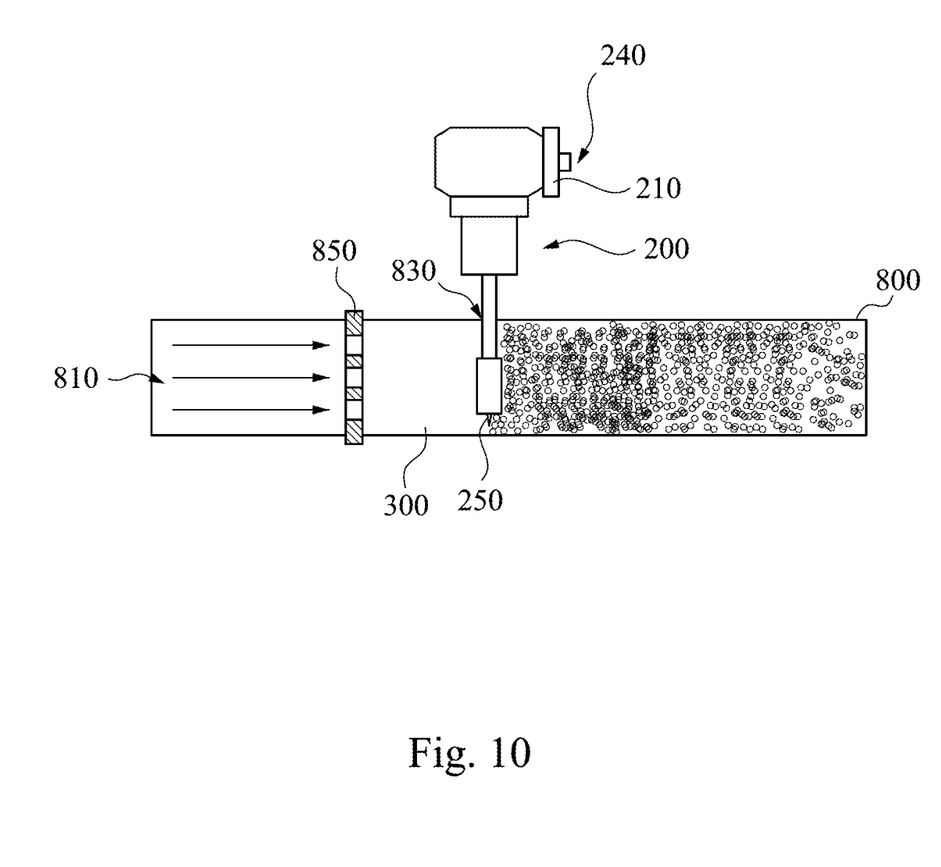
FIG. 10 is a schematic enlarged view of the bubble generating tube and the plasma jet generating device according to some embodiments of the present disclosure.

Reference is made to FIG. 10. FIG. 10 is a schematic enlarged view of the bubble generating tube 800 and the plasma jet generating device 200 according to some embodiments of the present disclosure. In some embodiments, the bubble generating tube 800 further includes a liquid separating component 850 between the inlet 810 and the device insertion portion 830. The liquid dividing component 850 can be a nozzle or a metal mesh (as shown in FIG. 10), but should not be limited thereto. The liquid separating component 850 can be applied to influence the liquid 300 and thus to control or to decrease the sizes of the PAMBs 600 formed after the liquid 300 passes through the liquid dividing component 850 and interacts with the plasma jet 250.

Figure 11:
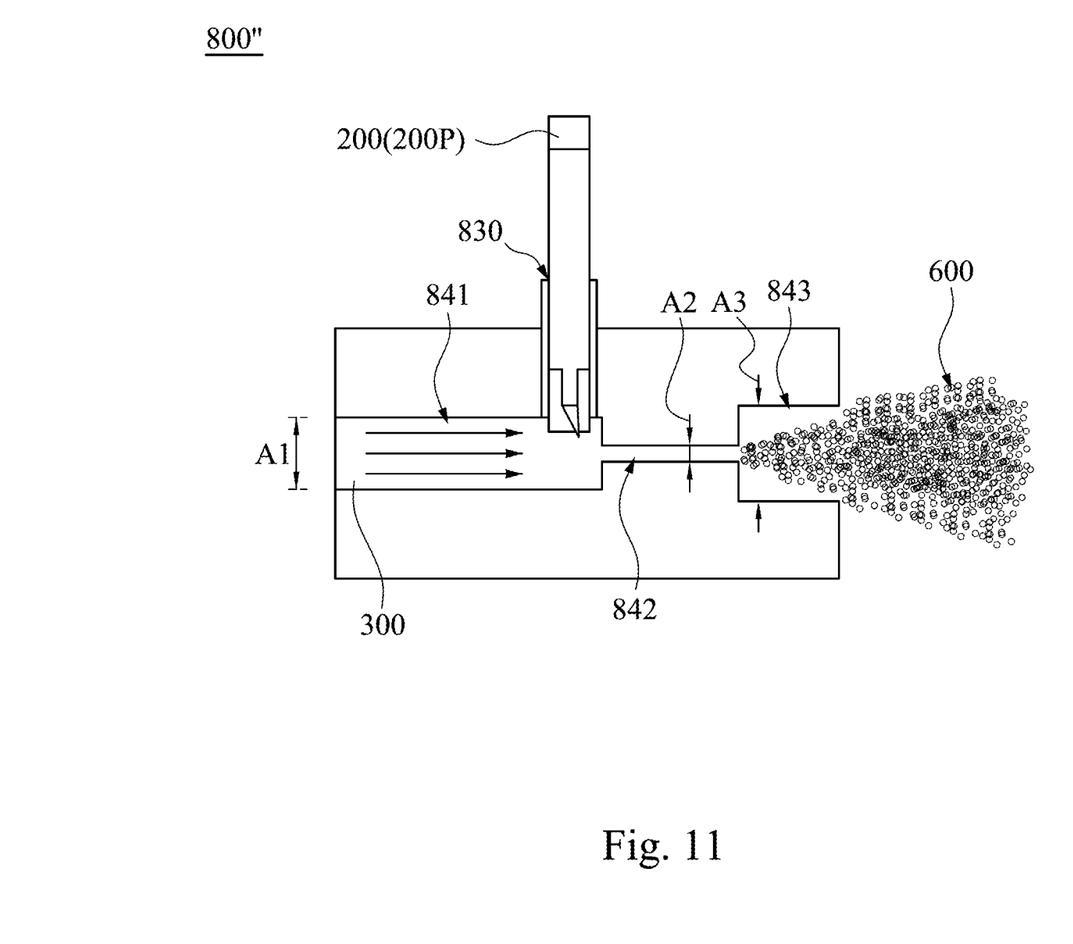
FIG. 11 is a schematic enlarged view of a bubble generating tube and plasma jet generating devices according to some embodiments of the present disclosure.

Reference is made to FIG. 11. FIG. 11 is a schematic enlarged view of a bubble generating tube 800" and a plasma jet generating devices 200 according to some embodiments of the present disclosure. In some embodiments, the bubble generating tube 800" includes a device insertion portion 830 at an end of an inlet tunnel 841 inside the bubble generating tube 800" to contain a plasma jet generating device 200 and allow the plasma jet generating device 200 produce plasma inside the inlet tunnel 841. A narrow channel 842, which has a cross-section area A2 smaller than a cross-section area A1 of the inlet tunnel 841 and acts as a nozzle, is connected to the inlet tunnel 841. Further, an outlet tunnel 843, which has a cross-section area A3 larger than that of the narrow channel 842, is connected to the narrow channel 842. The inlet tunnel 841 of the bubble generating tube can be connected to the water pump 100 as mentioned, and the PAMBs 600 are generated after the liquid 300 flow passes through the narrow channel 842. In this configuration, smaller PAMBs 600 per unit time may be formed in the bubble generating tube 800' due to higher shear force.

In summary, embodiments of the present disclosure provide a liquid treatment apparatus capable of creating a situation having three-phase fluids (plasma, gas, and liquid) which can produce reactive chemical species capsulated in microbubbles due to velocity differences between different phases of fluids. Microbubbles generated by turbulences and shear forces caused by the velocity differences exhibit superior characteristics compared to existing technologies. Some of those superior characteristic are listed below 1. Large gas-liquid interfacial area; 2. Long residence time in the liquid; 3. High inner pressure of microbubbles; 4. Debye length issue/restriction is avoided due to different sequence of forming microbubbles compared to existing mechanisms, and the sizes of microbubbles can be further modified/reduced by specific metal meshes and/or nozzles to enhance solubility of chemical species in liquid (e.g., water), so as to dispose of biological contaminated liquid more efficiently; 5. Automatically entrained gas requires no gas cylinder, and still exhibits strong sterilization effect and can greatly reduce the cost of generating PAW; 6. The plasma and the microbubbles are combined in a relatively simple way as can be seen in the above embodiments, and the plasma is used to generate extremely strong oxidizing chemical species (e.g., hydroxyl radical (HO.) and superoxide radical (HOO.)) and the chemical species are encapsulated in the microbubbles, thus the solubility of those chemical species in water is improved; and 7. Discharging directly under the liquid surface can immediately treat the contaminated water which some short-lived species having very strong oxidative ability would interact with the pollutants directly so as to achieve better liquid treatment efficiency.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the method and the structure of the present disclosure without departing from the scope or spirit of the disclosure. In view of the foregoing, it is intended that the present disclosure cover modifications and variations of this disclosure provided they fall within the scope of the following claims.

What is claimed is:

1. A liquid treatment apparatus, comprising:
    a water pump comprising a liquid inlet and a liquid outlet to eject a liquid; and
    a plasma jet generating device comprising:
        a gas inlet configured to be located out of the liquid;
        a pair of electrodes configured to generate a plasma jet by a gas from the gas inlet;
        a plasma jet outlet configured to be immersed in the liquid and to emit the plasma jet generated by an electric field from the pair of the electrodes, wherein the plasma jet outlet is in proximity to the liquid outlet of the water pump such that the gas is forced being entrained into the gas inlet of the plasma jet generating device when the liquid is ejected out from the liquid outlet; and
        a porous material of a tubular shape and the plasma jet outlet being located inside the porous material.

2. The liquid treatment apparatus of claim 1, further comprising a liquid container, wherein the liquid is in the liquid container and the liquid inlet is configured to be immersed in the liquid of the liquid container, and the water pump is configured to eject the liquid from the liquid inlet through the liquid outlet.

3. The liquid treatment apparatus of claim 2, further comprising a valve on a wall of the liquid container and configured to control an amount of the liquid flowing out of the liquid container.

4. The liquid treatment apparatus of claim 2, further comprising a bubble generating tube, the bubble generating tube comprising:
    an inlet connected to the liquid outlet of the water pump;
    an outlet connected to the liquid container; and
    a device insertion portion on a sidewall of the bubble generating tube and between the inlet and the outlet, wherein the plasma jet generating device is disposed on the device insertion portion, wherein the plasma jet outlet is in close proximity to another side wall that is opposite to the sidewall with the device insertion portion thereon.

5. The liquid treatment apparatus of claim 4, wherein the bubble generating tube further comprises another device insertion portion and another plasma jet generating device disposed on the another device insertion portion, wherein the another device insertion portion is on the sidewall of the bubble generating tube and between the inlet and the outlet, and the another device insertion portion is spaced apart from the device insertion portion.

6. The liquid treatment apparatus of claim 5, wherein a flow tunnel of the bubble generating tube is divided into two branches between the inlet and the outlet, and the two branches are respectively connected to the device insertion portion and another device insertion portion.

7. The liquid treatment apparatus of claim 4, wherein the bubble generating tube further comprises a liquid separating component between the inlet and the device insertion portion.

8. The liquid treatment apparatus of claim 1, wherein the pair of the electrodes comprises a first electrode and a second electrode, and the plasma jet generating device further comprises a dielectric portion between the first electrode and the second electrode.

9. The liquid treatment apparatus of claim 8, wherein the dielectric portion and the first electrode define a channel therebetween.

10. The liquid treatment apparatus of claim 9, wherein the first electrode is connected to the power electrode, and the second electrode is connected to the ground.

11. The liquid treatment apparatus of claim 9, wherein the first electrode is connected to the ground, and the second electrode is connected to the power electrode.

12. The liquid treatment apparatus of claim 9, wherein the first electrode is enclosed by the second electrode on a plane perpendicular to an extension direction of the channel.

13. The liquid treatment apparatus of claim 1, wherein there is no artificial bubbles in the liquid when the liquid is ejected out of the water pump.

14. The liquid treatment apparatus of claim 1, wherein the liquid is directly treated by the plasma jet.

15. The liquid treatment apparatus of claim 1, wherein the liquid is recycled by the water pump to be repeatedly treated by the plasma jet.

16. A liquid treatment apparatus, comprising:
a bubble generating tube comprising an inlet tunnel and a narrow channel connected to the inlet tunnel, the narrow channel having a cross-section area smaller than a cross-section area of the inlet tunnel; and
a plasma jet generating device disposed on the bubble generating tube at the inlet tunnel,
wherein the plasma jet generating device is configured to produce a plasma jet inside the inlet tunnel.

17. The liquid treatment apparatus of claim 16, wherein the bubble generating tube is connected to a water pump, and the narrow channel is connected to the inlet tunnel.

18. The liquid treatment apparatus of claim 16, wherein the bubble generating tube further comprises an outlet tunnel with a cross-section area larger than the cross-section area of the narrow channel, and the outlet tunnel is connected to the narrow channel.

19. The liquid treatment apparatus of claim 16, wherein the bubble generating tube further comprises a device insertion portion configured to contain the plasma jet generating device and allow the plasma jet generating device produce plasma inside the inlet tunnel.

* * * * *